United States Patent
Koga et al.

(10) Patent No.: US 6,853,022 B2
(45) Date of Patent: Feb. 8, 2005

(54) SEMICONDUCTOR MEMORY DEVICE

(75) Inventors: Tsuyoshi Koga, Hyogo (JP); Yoshiyuki Ishigaki, Hyogo (JP); Motoi Ashida, Hyogo (JP); Yukio Maki, Hyogo (JP); Yasuhiro Fujii, Hyogo (JP); Tomohiro Hosokawa, Hyogo (JP); Takashi Terada, Hyogo (JP); Makoto Dei, Hyogo (JP); Yasuichi Masuda, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 53 days.

(21) Appl. No.: 10/352,987

(22) Filed: Jan. 29, 2003

(65) Prior Publication Data

US 2004/0032764 A1 Feb. 19, 2004

(30) Foreign Application Priority Data

Aug. 14, 2002 (JP) ...................................... 2002-236332

(51) Int. Cl.[7] ............................................. H01L 27/108
(52) U.S. Cl. ........................... 257/298; 257/22; 257/24; 257/25; 365/149; 365/175
(58) Field of Search .............................. 257/22, 24, 25; 365/149, 175

(56) References Cited

U.S. PATENT DOCUMENTS

| | | | |
|---|---|---|---|
| 5,278,459 A | 1/1994 | Matsui et al. | |
| 5,498,563 A | 3/1996 | Okamoto | |
| 5,714,778 A | 2/1998 | Yamazaki | |
| 5,844,837 A | 12/1998 | Yoshikawa | |
| 5,953,249 A | * 9/1999 | van der Wagt | 365/175 |
| 6,081,443 A | * 6/2000 | Morishita et al. | 365/149 |

FOREIGN PATENT DOCUMENTS

DE          195 42 240 A1     5/1996

* cited by examiner

*Primary Examiner*—David Nelms
*Assistant Examiner*—Mai-Huong Tran
(74) *Attorney, Agent, or Firm*—McDermott Will & Emery LLP (57) ABSTRACT

A semiconductor memory device having as its main storage portion a capacitor storing charges as binary information and an access transistor controlling input/output of the charges to/from the capacitor, and eliminating the need for refresh, is obtained. The semiconductor memory device includes a capacitor with a storage node located above a semiconductor substrate and holding the charges corresponding to a logical level of stored binary information, an access transistor located on the semiconductor substrate surface and controlling input/output of the charges accumulated in the capacitor, and a latch circuit located on the semiconductor substrate and maintaining a potential of the capacitor storage node. At least one of circuit elements constituting the latch circuit is located above the access transistor.

11 Claims, 11 Drawing Sheets

SEMICONDUCTOR MEMORY DEVICE

BACKGROUND OF THE INVENTION

1. Field of the Invention

The present invention relates to semiconductor memory devices, and more particularly to a dynamic random access memory (DRAM) eliminating the need for refresh.

2. Description of the Background Art

A configuration of a conventional DRAM memory cell is explained with reference to FIG. 11.

Figure 11:
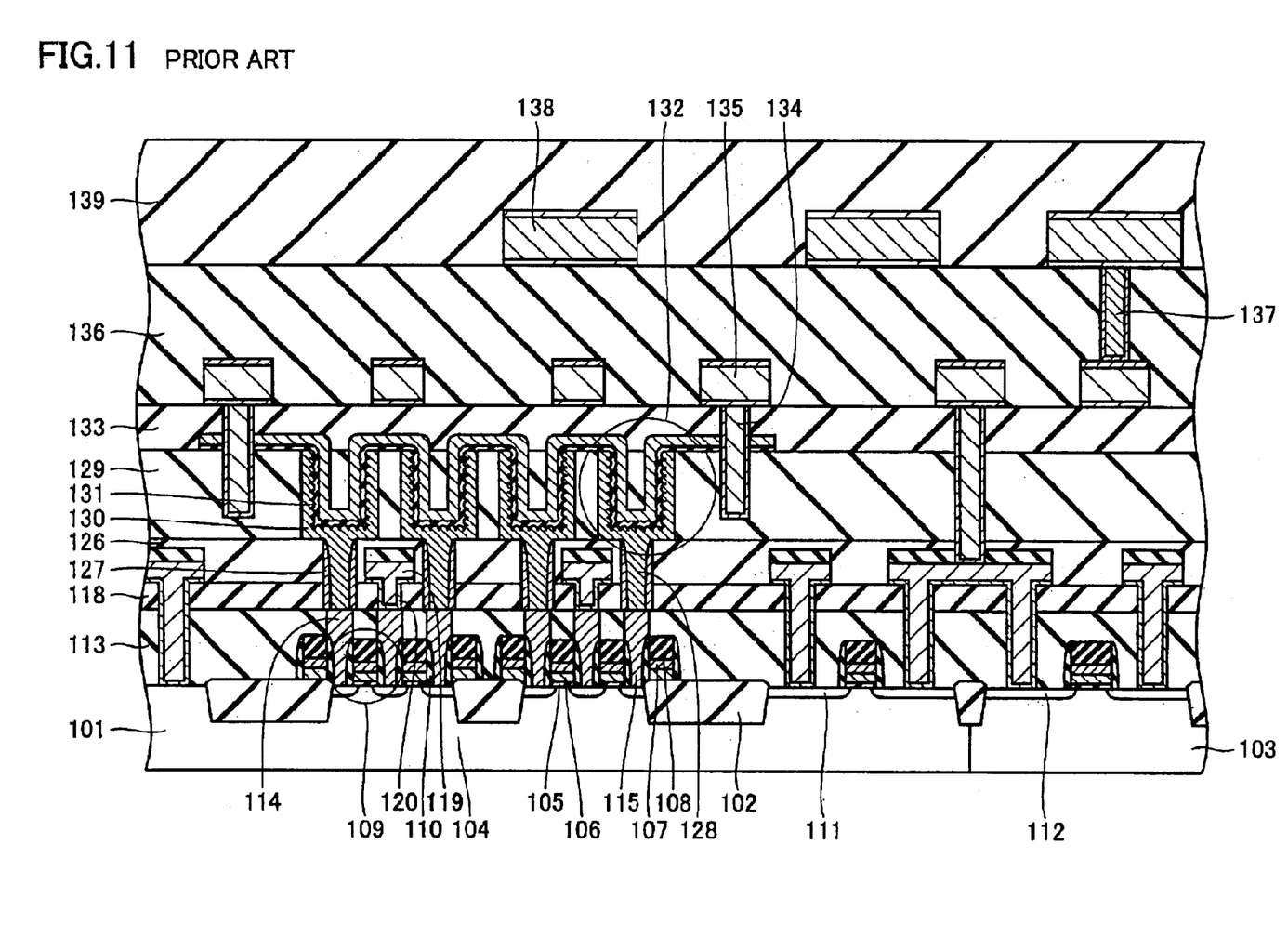
FIG. 11 is a cross sectional view of a DRAM as a conventional semiconductor memory device.

In FIG. 11, a silicon substrate 101 is provided with an element isolating region 102 for separating element regions from each other. An n type well 103 and a p type well 104 are provided in silicon substrate 101 beneath the element regions. A gate oxide film 105 is placed in contact with the silicon substrate where an element is to be formed. A doped polysilicon 106 is located on gate oxide film 105, and a WSi layer 107 and a two-layer film 108 formed of silicon oxide film and silicon nitride film are arranged thereon. A gate electrode 109 includes the above-described doped polysilicon 106, WSi layer 107 and two-layer film 108. Gate electrode 109 has its sidewall insulated by a sidewall 110.

An n+ type source/drain region 111 is disposed in p type well 104, and a p+ type source/drain region 112 is disposed in n type well 103. An interlayer silicon oxide film 113 is arranged to cover the above-described structure, and a buried contact 114 on silicon substrate is placed to penetrate interlayer silicon oxide film 113 in a vertical direction. Similarly, a poly-pad 115 on silicon substrate is arranged. An interlayer silicon oxide film 118 is disposed to cover upper ends of buried contact 114 on silicon substrate and poly-pad 115 on silicon substrate. A tungsten bit line contact 120 and a bit line 119 are arranged to penetrate interlayer silicon oxide film 118 in a vertical direction, to electrically connect with the source/drain region thereunder. An interlayer silicon oxide film 126 is placed to cover them. Penetrating interlayer silicon oxide films 126 and 118 in a vertical direction, a buried contact 127 and a poly-pad 128 are arranged to electrically connect with underlying buried contact 114 on silicon substrate and poly-pad 115 on silicon substrate, respectively.

An interlayer silicon nitride film/interlayer silicon oxide film 129 is further arranged to cover the above-described structure. A storage node 130 is located in interlayer silicon nitride film/interlayer silicon oxide film 129, and a dielectric film 131 is arranged thereon, thereby forming a cylindrical capacitor 132. An interlayer silicon oxide film 133 is arranged to cover the cylindrical capacitor and others. A metal contact 134 is placed to penetrate interlayer silicon oxide film 133 to electrically connect to an electrode of the cylindrical capacitor 132. A metal interconnection 135 is located on interlayer silicon oxide film 133, continuously on metal contact 134. An interlayer silicon oxide film 136 is arranged to cover metal interconnection 135, and a metal contact 137 is placed to penetrate the relevant film 136. A metal interconnection 138 is placed thereon, and a passivation film 139 is further placed to cover metal interconnection 138.

With the structure as described above, an access transistor including gate electrode 109 is turned on/off as it receives a signal from a word line (not shown) at the gate electrode, and controls transfer of charges between bit line 119 and capacitor 132. In a state where charges are accumulated on the capacitor, the storage node has its potential maintained at a prescribed high potential, and a stored state of digital information is maintained. That is, when capacitor 132 is charged, the storage node is in a high potential state, which is assumed to be, e.g., an on state. By comparison, when capacitor 132 is uncharged, the storage node is in a zero potential state, which is assumed to be, e.g., an off state. A DRAM thus serves as a storage device which stores binary information by accumulating charges on a capacitor.

With the above-described structure, however, the charges accumulated on the capacitor would leak from the storage node via the well to the semiconductor substrate over a prescribed period of time, resulting in loss of charges of the capacitor. Such leakage and loss of charges correspond to loss of stored information. To prevent this, in a DRAM, refresh has been repeated at prescribed periods to restore the charges lost from the capacitor, before complete loss of the charges. As such, the DRAM requires a circuit for the refresh. A large amount of power is consumed for the refresh, causing an increase of the power consumption of the DRAM.

A static random access memory (SRAM) is known to make such refresh unnecessary. With the SRAM, however, six transistors per memory cell have to be formed on a silicon substrate. This considerably increases the memory cell size compared to the case of the DRAM.

SUMMARY OF THE INVENTION

A primary object of the present invention is to provide a semiconductor memory device eliminating the need for refresh, which has, as its storage portion, a capacitor storing charges corresponding to binary information and an access transistor controlling input/output of the charges to/from the capacitor. A secondary object of the present invention is to significantly downsize the semiconductor memory device compared to an SRAM.

A semiconductor memory device according to the present invention includes: a capacitor located above a semiconductor substrate, having a storage node and holding charges corresponding to a logical level of binary information; an access transistor located in a surface of the semiconductor substrate and controlling input/output of the charges accumulated in the capacitor; and a latch circuit located on the semiconductor substrate and maintaining a potential of the storage node of the capacitor. At least one of circuit elements constituting the latch circuit is located above the access transistor.

With this configuration, the potential of the storage node is maintained at a stable level during a prescribed period of time by the latch circuit. Thus, refresh for restoring charges of the capacitor becomes unnecessary for reading and writing digital information, and consumed power is restricted. Provision of a refresh circuit also becomes unnecessary.

Further, a circuit element constituting the latch circuit is arranged above the access transistor. Such three-dimensional arrangement makes it possible to significantly reduce the two-dimensional size of the device compared to that of an SRAM.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention are described with reference to the drawings.

First Embodiment

Figure 1:
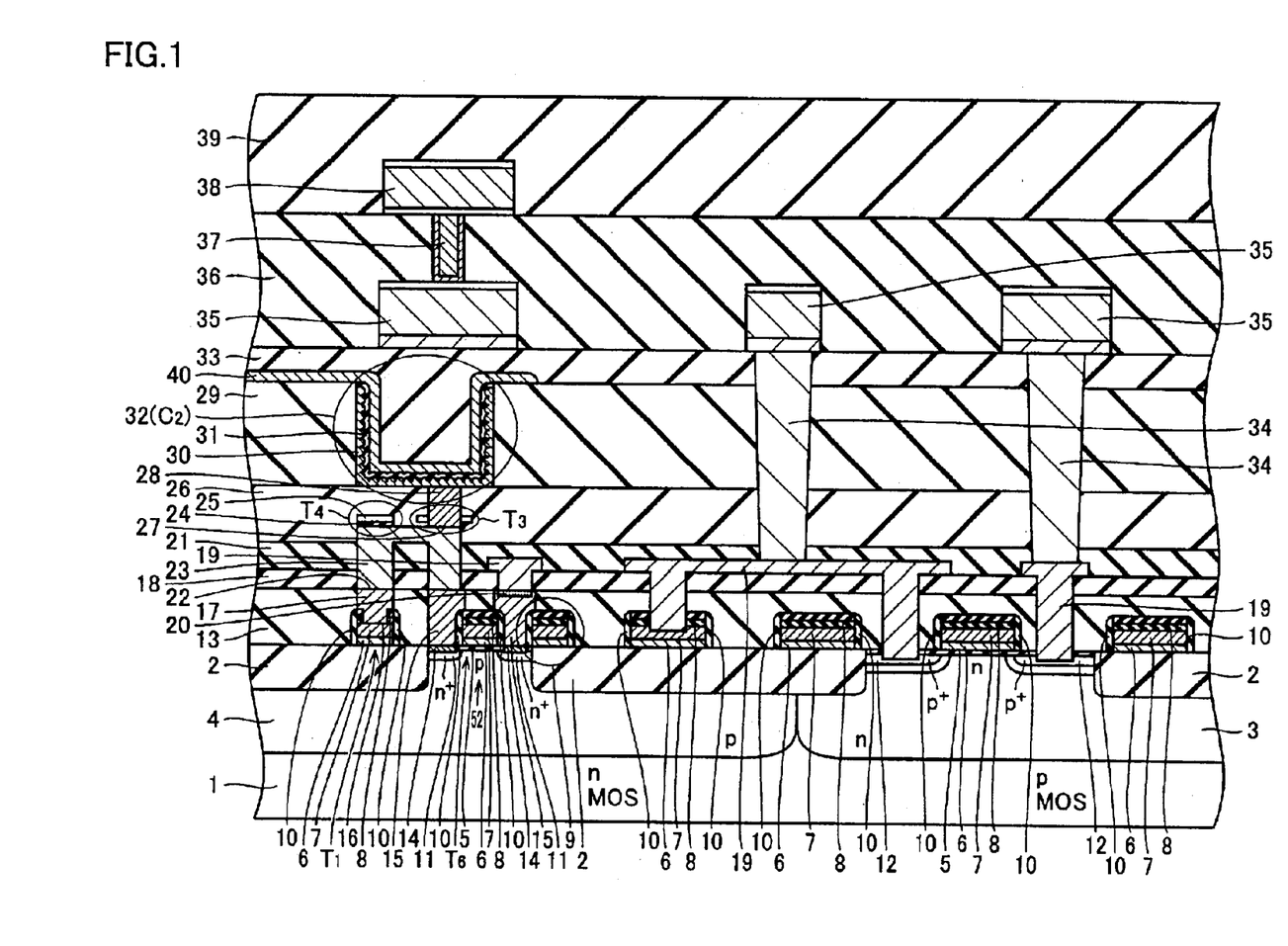
FIG. 1 is a cross sectional view of a semiconductor memory device according to a first embodiment of the present invention.

Referring to FIG. 1, a silicon substrate 1 is provided with an element isolating region 2 for separating element regions from each other. An n type well 3 and a p type well 4 are provided in silicon substrate 1 beneath the element regions. A gate oxide film 5 is located in contact with a region of the silicon substrate where a transistor is to be formed. A doped polysilicon 6 is located on gate oxide film 5, and a WSi layer 7 is located thereon. A two-layer film 8 formed of silicon oxide film and silicon nitride film is stacked on WSi layer 7 in contact therewith. A gate electrode 9 is arranged with the above-described doped polysilicon 6, WSi layer 7 and silicon oxide film/silicon nitride film 8. Gate electrode 9 has its sidewall insulated by a sidewall 10, and has its upper surface insulated by silicon oxide film/silicon nitride film 8.

An n+ type source/drain region 11 is arranged in p type well 4, and a p+ type source/drain region 12 is arranged in n type well 3. An interlayer silicon oxide film 13 is arranged to cover the above-described structure, and a buried contact 14 on silicon substrate is buried at the bottom of a conductive path penetrating interlayer silicon oxide film 13 in a vertical direction. A poly-pad 15 on silicon substrate as the conductive path is arranged on buried contact 14 on silicon substrate. A buried contact 16 on gate electrode is buried for electrical connection with WSi layer 7 of the gate electrode, and a poly-pad 17 on gate electrode as a conductive path is arranged thereon. A buried contact 22 is arranged on poly-pad 15 on silicon substrate and poly-pad 17 on gate electrode to ensure electrical connection. An electrode for a thin film transistor, i.e., a TFT electrode 23, is provided on buried contact 22. This TFT is a load transistor of an inverter constituting a flip-flop circuit as a latch circuit.

An interlayer silicon oxide film 18 is arranged to cover upper ends of buried contact 14 on silicon substrate and poly-pad 15 on silicon substrate. A tungsten interconnection 19 and a tungsten bit line contact 20 are arranged to penetrate interlayer silicon oxide film 18 in a vertical direction to electrically connect to the source/drain region thereunder. An interlayer silicon oxide film 21 is deposited to cover them.

TFT electrode 23 penetrates interlayer silicon oxide film 21 and further extends upward and downward. A TFT gate oxide film 24 is provided on TFT electrode 23 in contact therewith, and a TFT polysilicon 25 is arranged thereon. Source/drain and channel regions are formed in TFT polysilicon 25. Thus, the (bulk) transistor located on the silicon substrate surface and the thin film transistor described above are arranged upside down with each other.

An interlayer silicon nitride film/interlayer silicon oxide film 26 is provided to cover the TFT. A buried contact 27 is provided to electrically connect to TFT electrode 23, and a poly-pad 28 penetrating interlayer silicon nitride film/interlayer silicon oxide film 26 is buried thereon. An interlayer silicon oxide film 29 is provided further thereon.

A capacitor is arranged in a portion penetrating interlayer silicon oxide film 29. A storage node 30 is provided in connection with the upper end of poly-pad 28, and a capacitor film 31 of dielectric material is formed thereon. A capacitor electrode 40 is located further thereon, which is set to a ground potential. The storage node is preferably subjected to a surface roughening process to increase the capacity of the capacitor, although the surface roughening process is not necessarily required. A capacitor 32 ($C_2$), being a cylindrical capacitor, is formed in a portion delimited by a circle in FIG. 1. An interlayer silicon oxide film 33 is provided to cover the upper electrode of the capacitor and interlayer silicon oxide film 29. A metal contact 34 is buried to penetrate interlayer insulating films 21, 24, 26, 29 and 33, and a metal interconnection 35 is provided on metal contact 34. Metal interconnection 35 is covered with an interlayer silicon oxide film 36, and a metal contact 37 is formed therein to electrically connect to metal interconnection 35. Metal interconnection 38 is provided in contact with an upper end of metal contact 37. A passivation film 39 is located further thereon.

In the structure as described above, access transistor $T_6$ is formed in the surface of silicon substrate 1, and capacitor 32 ($C_2$) is formed above the silicon substrate. The gate electrode of the access transistor is formed in interlayer insulating film 13 located in contact with the silicon substrate. This interlayer insulating film is called a lower interlayer insulating film. The interlayer insulating film in which the capacitor is formed is called an upper interlayer insulating film. An interlayer insulating film located between the lower interlayer insulating film and the upper interlayer insulating film is called an intermediate interlayer insulating film.

The source/drain region 11 of access transistor $T_6$ and the storage node 30 of capacitor 32 ($C_2$) are electrically connected with each other via conductive path 14, 15, 23, 27 and 28 penetrating interlayer insulating films 13, 18, 21, 24, 26 and TFT polysilicon 25. A terminal of the flip-flop circuit is connected to the conductive path, and the potential of the storage node is kept constant at a prescribed level. Transistor $T_1$ and thin film transistor $T_3$ have their gate electrodes electrically connected to each other via contacts 16, 17, 22 and 23.

Figure 2:
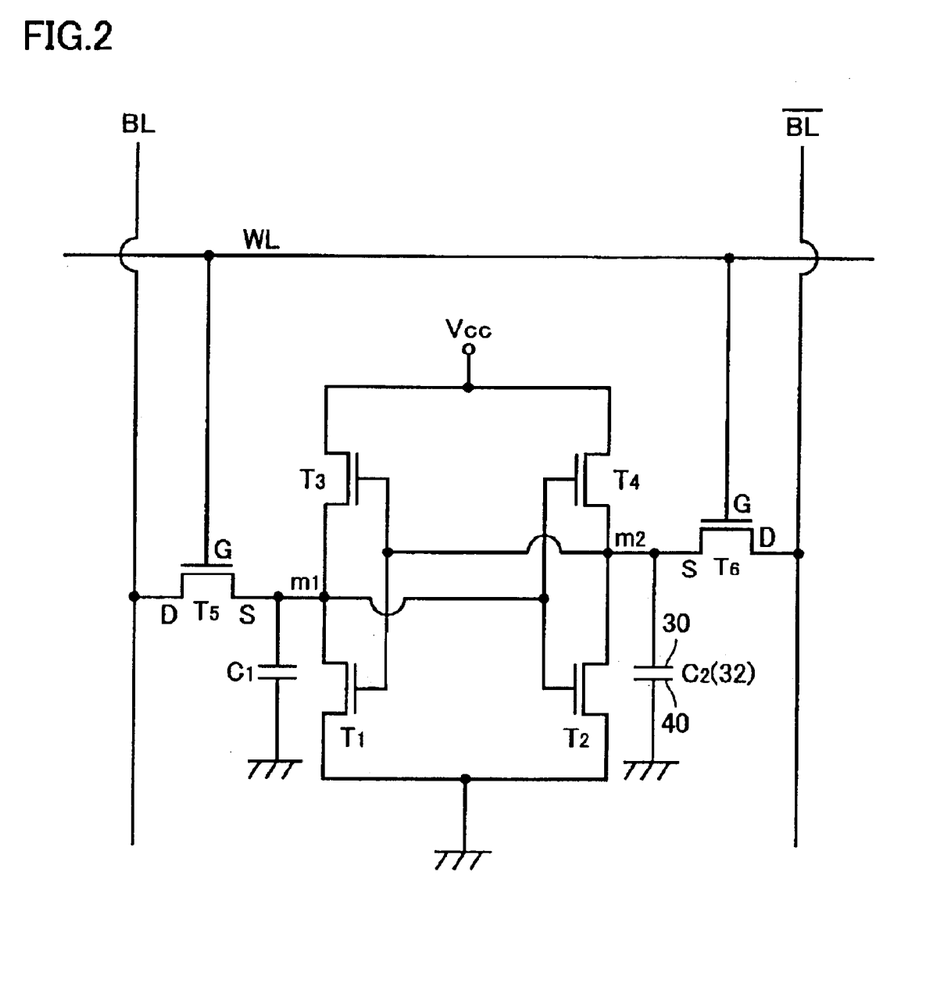
FIG. 2 is a circuit diagram of the semiconductor memory device shown in FIG. 1.

FIG. 2 is a circuit diagram showing the semiconductor memory device described above. A source S of access transistor $T_5$ having its drain D connected to bit line BL and a storage node of capacitor $C_1$ are electrically connected with each other, thereby forming a portion corresponding to a conventional DRAM memory cell. A source S of access transistor $T_6$ having its drain D connected to complementary bit line/BL and a storage node 30 of capacitor $C_2$ are electrically connected with each other, again forming the portion corresponding to the conventional DRAM memory cell.

Transistors $T_1$ and $T_3$ constitute one CMOS (Complementary Metal Oxide Semiconductor) inverter, and transistors $T_2$ and $T_4$ form another CMOS inverter. The flip-flop circuit formed of these two CMOS inverters constitutes a latch circuit for the aforementioned DRAM memory cell. The latch circuit is formed across the semiconductor substrate surface, lower interlayer insulating film and intermediate interlayer insulating film.

Writing and reading of signals in the memory cell circuit as described above are now described with reference to FIG. 2. Bit line BL and complementary bit line/BL are connected to the memory cell described above. At the time of writing, a word line is turned on, and opposite signals are applied to bit line BL and complementary bit line /BL. For example, when an on potential is applied to bit line BL, the potential of a connect point m1 becomes an on potential, so that capacitor $C_1$ is charged. A minus potential or zero potential is applied from complementary bit line/BL to a connect point m2. Thus, connect point m2 attains an off potential, and capacitor $C_2$ is uncharged. In the flip-flop circuit, connect point m1 is at a high potential, whereas connect point m2 is at a zero potential or ground potential. The potential at connect point m1 is maintained stably unless a potential is externally applied. Thus, even if charges are leaking from capacitor $C_1$, charges in compensation for the leakage are refilled to keep the connect point m2 at a prescribed potential.

By comparison, at the time of reading, a potential difference between bit line BL and complementary bit line/BL is sensed and amplified by a sense amplifier, to read data. In either case, the potentials of connect points m1 and m2 are kept at prescribed potentials, so that leakage of capacitors $C_1$ and $C_2$ are prevented. As a result, the charges of the capacitors can be kept constant without refresh, and thus, power required for the refresh is saved.

Some of the transistors illustrated in FIG. 2 are shown in cross section in FIG. 1. Among them, transistor $T_1$ is a drive transistor of a CMOS inverter, and thin film transistor $T_3$ is a load transistor of the same CMOS inverter. Transistors $T_1$ and $T_3$ have their gate electrodes electrically connected to each other by plug contacts 16, 17, 22, 23, 27, 28. The gate electrode 23 is connected to source S of access transistor $T_6$ via plug contacts 15, 14. The conductive layer 27 within the plug contact is connected to storage node 30 of capacitor $C_2$ through plug contact 28. Another electrode 40 of capacitor $C_2$ is set to a ground potential. Another thin film transistor $T_4$ is connected to another capacitor $C_1$ through plug contacts not shown in the cross sectional view of FIG. 1. Transistors not appearing in the cross sectional view of FIG. 1 are those formed on the silicon substrate surface, which can be manufactured with a common MOS transistor forming method.

The thin film transistors $T_3$, $T_4$ are formed in three dimensions above other transistors $T_1$, $T_2$. This allows remarkable downsizing of the semiconductor memory device of the present invention.

Figure 3:
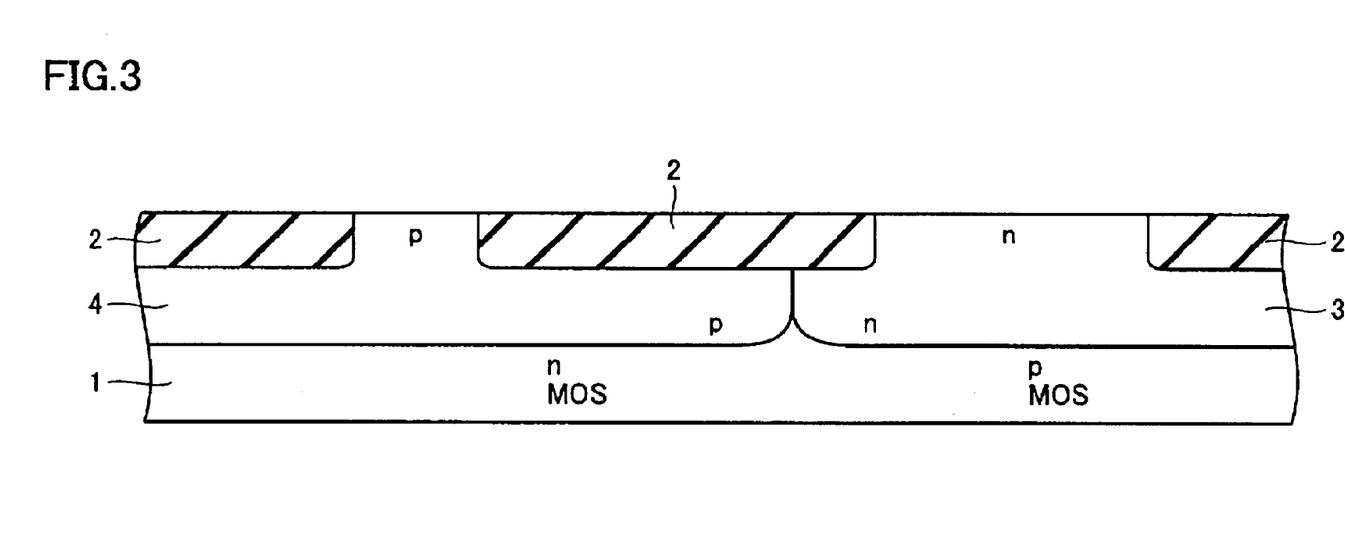
FIG. 3 illustrates a state where an element isolating region is formed on a silicon substrate in manufacture of the semiconductor memory device of FIG. 1.

Hereinafter, a manufacturing method of the semiconductor memory device described above is explained with reference to FIGS. 3–7. Firstly, an element isolating region 2 is selectively formed on silicon substrate 1 (see FIG. 3). Here, STI (Shallow Trench Isolation) is employed for the element isolation. Next, referring to FIG. 3, a bottom n type well region is formed in a deep region of silicon substrate 1, and an n type well 3 is formed in a region where a p MOS transistor is to be formed. At this time, an ion implantation system is used to introduce phosphorus (P) as n type impurity, arsenic for isolation, and boron for channel doping. A p type well 4 is formed in a region where an n MOS transistor is to be formed. Using an ion implantation system, boron for the p type well, boron for isolation, and boron for channel doping are introduced. At this time, conditions on the ion implantation may be differentiated employing a mask, such that a memory cell and a peripheral circuit attain threshold voltages Vth of desired levels.

Figure 4:
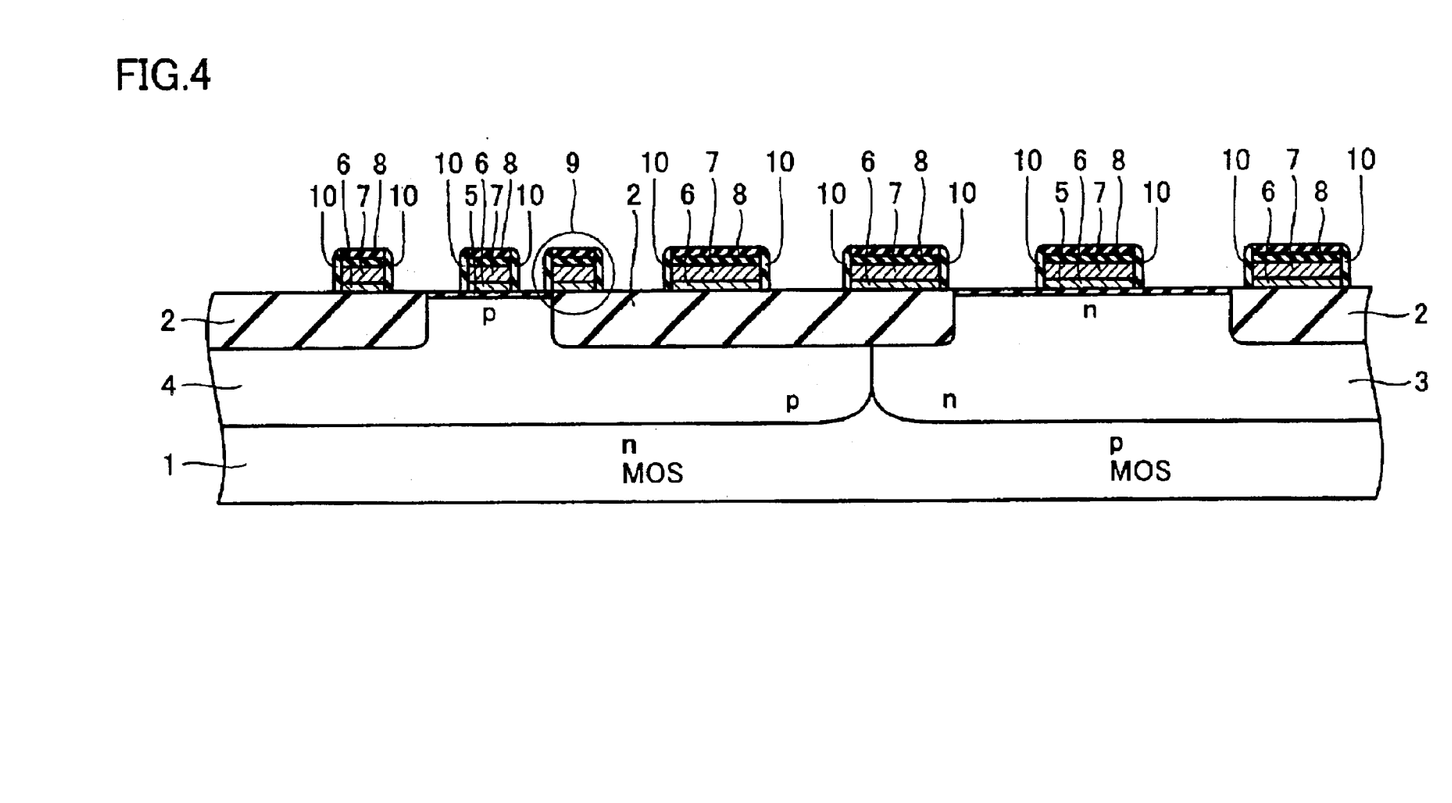
FIG. 4 illustrates a state where a sidewall of a gate electrode is formed.

Next, referring to FIG. 4, a gate oxide film 5, a doped polysilicon 6, a WSi film 7, and a two-layer film 8 of silicon oxide film/silicon nitride film are deposited and etched to form a gate electrode 9. Arsenic or phosphorus on the order of 1E13 is introduced solely to the n MOS region, to form an n-region. Next, a silicon oxide film and a silicon nitride film are deposited and etched to form a sidewall 10.

Figure 5:
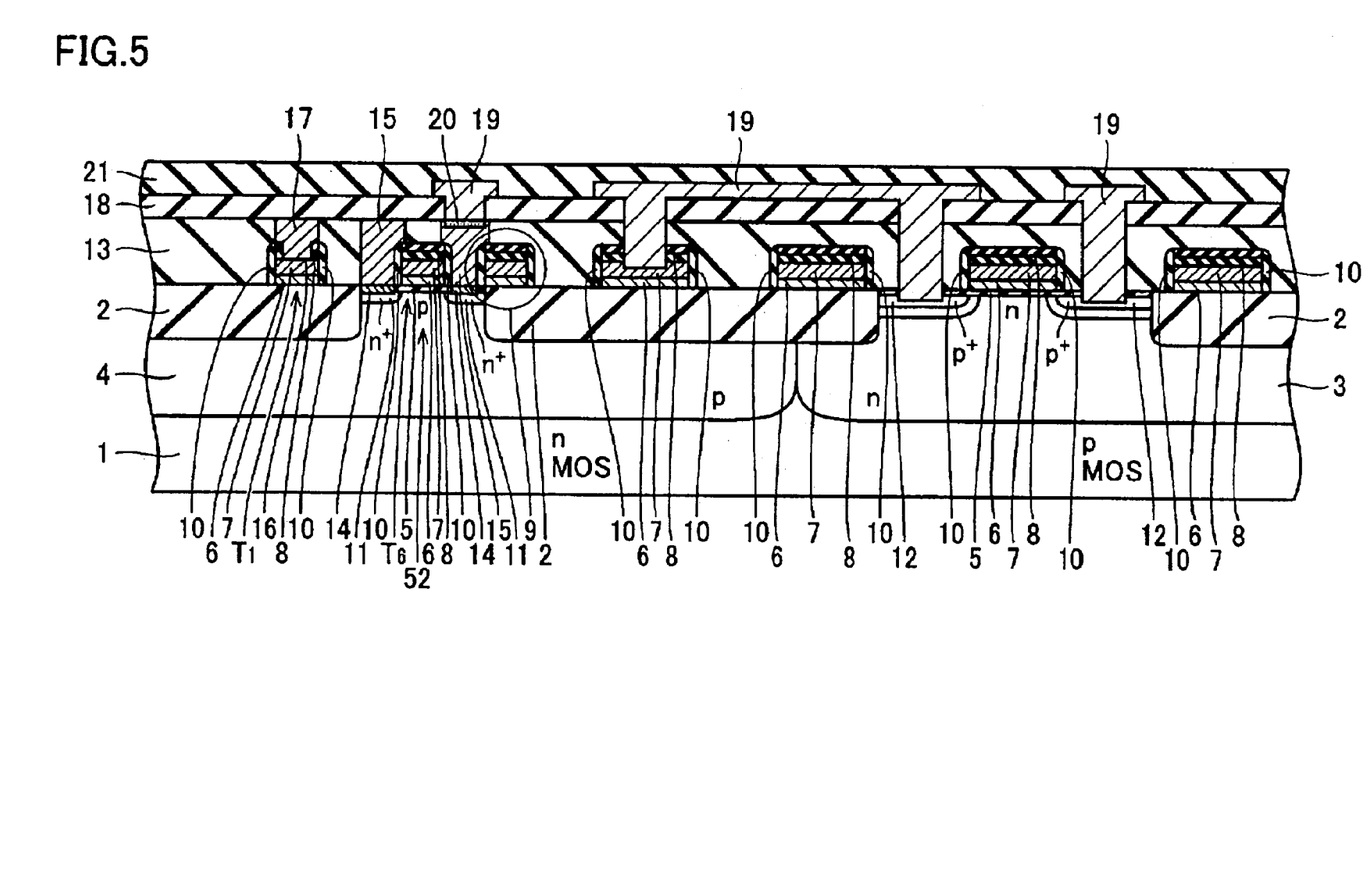
FIG. 5 illustrates a state where an interlayer silicon oxide film 21 is deposited.

Next, referring to FIG. 5, arsenic is introduced in high concentration into the n MOS region to form an n+ type source/drain region 11 of n type transistor $T_6$. Boron is then introduced in high concentration into the p MOS region to form a p+ type source/drain region 12. Next, an interlayer silicon oxide film 13 is deposited and then etched to form a buried contact 14 on silicon substrate for electrical connection with silicon substrate 1. Buried contact 14 on silicon substrate is electrically connected to the source of transistor $T_6$. Next, a doped polysilicon is deposited, and a poly-pad 15 on silicon substrate is formed by etch back or CMP.

Subsequently, interlayer silicon oxide film 13 is etched to form a buried contact 16 on gate electrode, for electrical connection with gate electrode 9 of transistor $T_1$. Next, a doped polysilicon is deposited, and a poly-pad 17 on gate electrode is formed by etch back or CMP. An interlayer silicon oxide film 18 is then deposited. Interlayer silicon oxide film 18 is etched to form a buried contact 20 for tungsten interconnection, to electrically connect silicon substrate 1, gate electrode 9, poly-pad 15 on silicon substrate, and a tungsten interconnection 19. Next, Ti, TiN, W or other high melting point metal and a silicon nitride film are deposited and etched to form tungsten interconnection 19, to be used as ground line and metal contact pad. An interlayer silicon oxide film 21 is then deposited.

Figure 6:
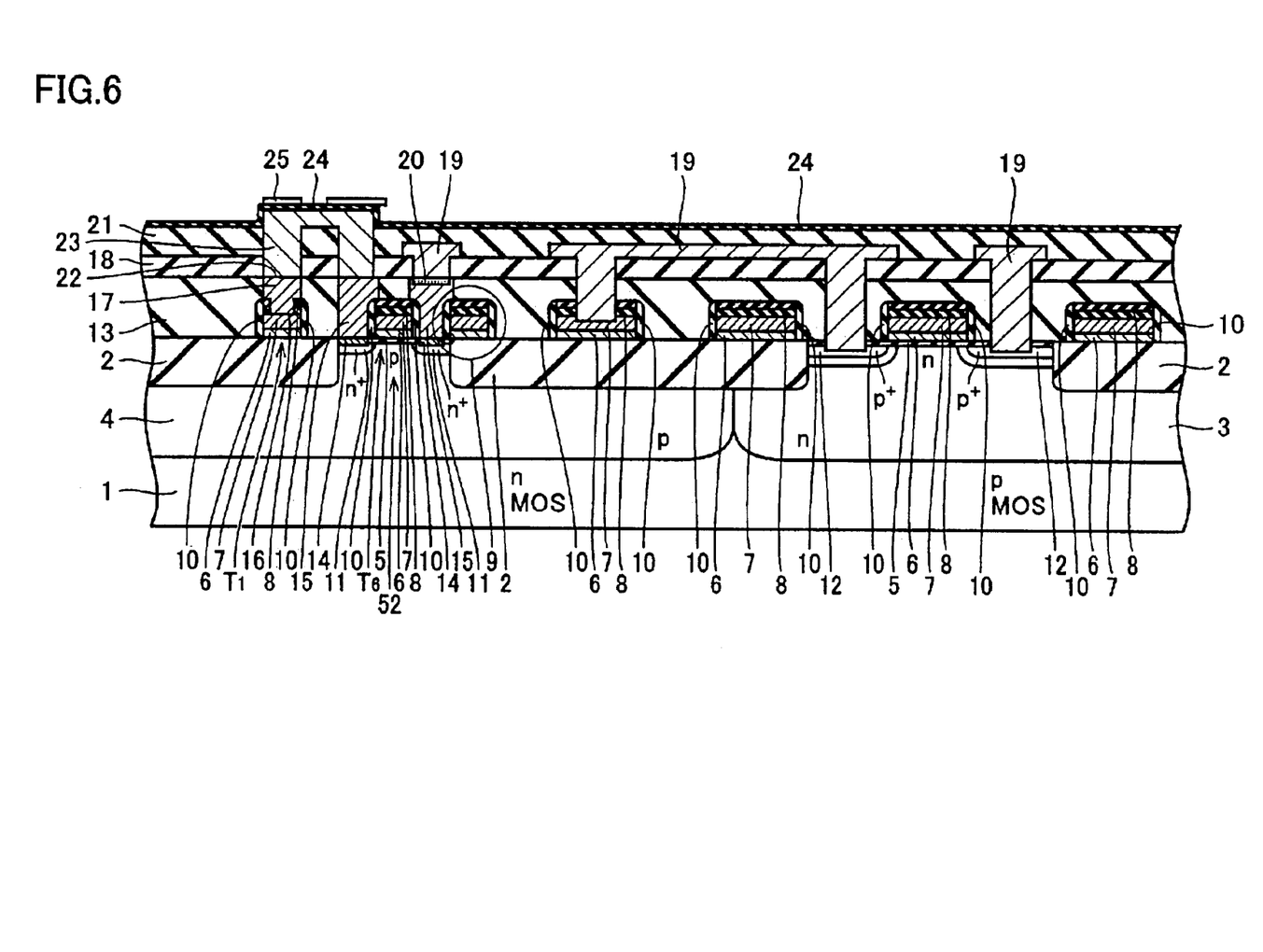
FIG. 6 illustrates a state where a polysilicon film for a thin film transistor is formed.

Next, referring to FIG. 6, interlayer silicon oxide films 18, 21 are etched to form a buried contact 22 for connection with poly pads 15, 17. At this time, the contact dimension may be reduced by depositing and etching a silicon nitride film.

Next, a doped polysilicon is deposited and etched to form a TFT electrode 23. Next, a silicon oxide film is deposited to form a TFT gate oxide film 24. Thereafter, an amorphous polysilicon is deposited, annealed and etched to form a polysilicon TFT 25 becoming the TFT's channel and source/drain regions. At this time, boron or arsenic for channel doping may be introduced such that the TFT attains a desired threshold voltage Vth. Next, boron is selectively introduced into polysilicon TFT 25 to form the source/drain region of the TFT.

Figure 7:
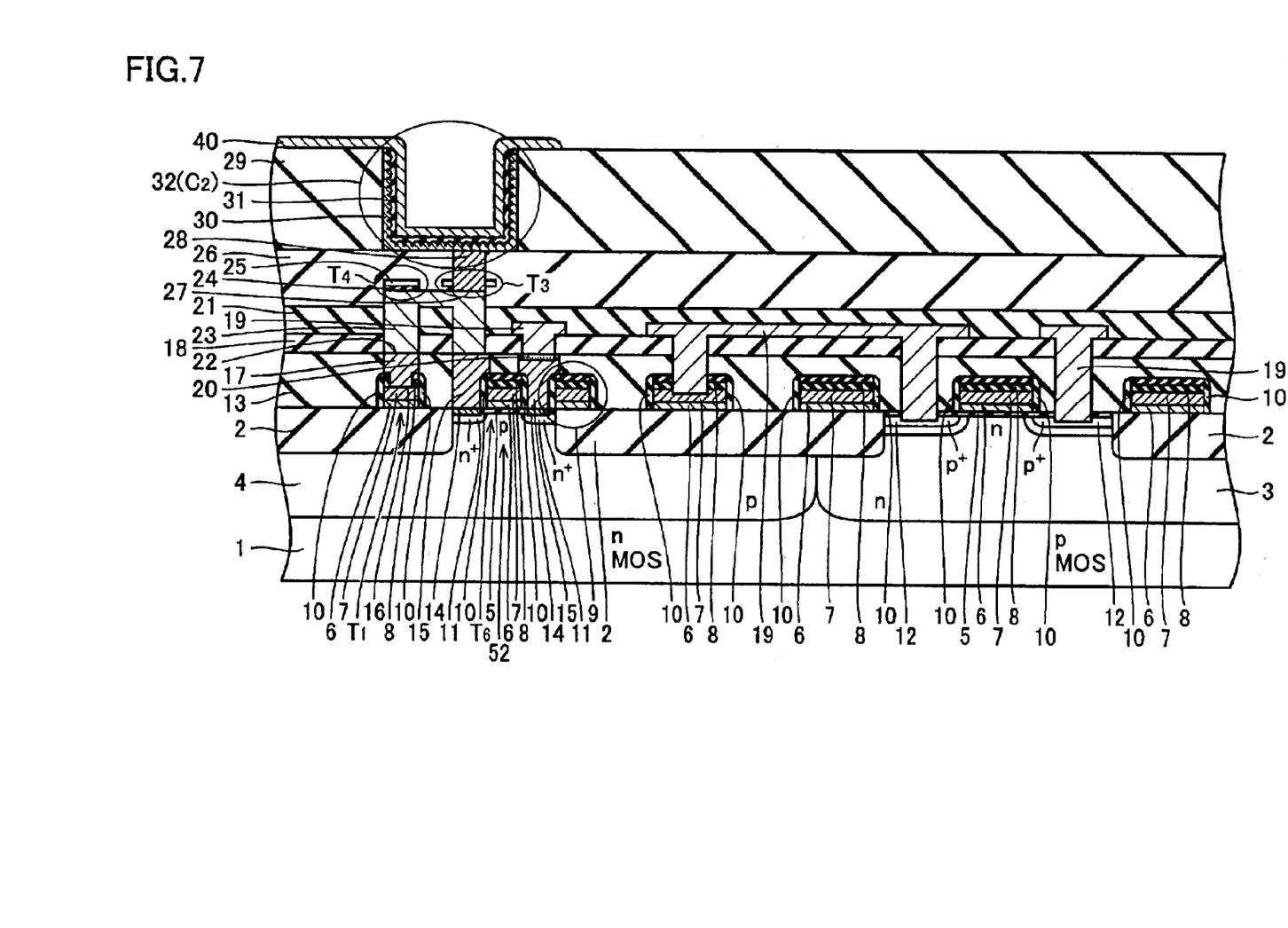
FIG. 7 illustrates a state where a cylindrical capacitor is formed.

Next, referring to FIG. 7, an interlayer silicon oxide film 26 is deposited. Next, TFT gate oxide film 24, TFT polysilicon 25 and interlayer silicon oxide film 26 are etched collectively to form a buried contact 27, to connect TFT electrode 23 and TFT polysilicon 25 with storage node 30. Here, thin film transistors $T_3$, $T_4$ becoming load transistors of inverters are formed.

Next, a doped polysilicon is deposited and etched to form a poly-pad 28, to fill buried contact 27. Next, a silicon nitride film/silicon oxide film 29 is deposited and etched to form a cylindrical capacitor increasing the capacitor area.

Next, doped polysilicon and amorphous polysilicon are deposited and subjected to a surface roughening process, to form a storage node 30. A silicon nitride film is then deposited and oxidized to form a capacitor film 31 of dielectric material, and at the same time, doped amorphous polysilicon is deposited and etched to form a cylindrical capacitor 32 ($C_2$ in FIG. 2).

Next, referring to FIG. 1, an interlayer silicon oxide film 33 is deposited. Interlayer silicon oxide films 21, 24, 26, 29, 33 are etched to form a metal contact 34, for connection of the capacitor. TiN, tungsten (W) are then deposited and etched, and at the same time, Al—Cu, TiN are sputtered and etched, to form a metal interconnection 35. An interlayer silicon oxide film 36 is deposited, and then etched to form a metal contact 37 for connection with metal interconnection 35. TiN, tungsten (W) are then deposited and etched, and Al—Cu, TiN are sputtered and etched, so that a metal interconnection 38 is formed. Next, a plasma silicon nitride film and a polyimide film are formed as a passivation film 39, and a scribe line bonding pad is etched. The semiconductor memory device shown in FIG. 1 can be manufactured in the above-described manner.

The manufacturing method described above includes a step of forming an access transistor and a capacitor constituting a conventional DRAM memory cell (a1), and further includes, within the relevant step, a step of forming a latch circuit that is a flip-flop circuit having a thin film transistor as its load transistor (a2). The above manufacturing method can be realized by slightly modifying the existing production lines for DRAM. As described above, the transistors not shown in the cross sectional view of FIG. 1 are those formed on the silicon substrate surface, which can be manufactured using a common MOS transistor forming method. Accordingly, a semiconductor memory device corresponding to the circuit shown in FIG. 2 can be manufactured as explained above in conjunction with FIGS. 1 and 3–7.

Second Embodiment

Figure 8:
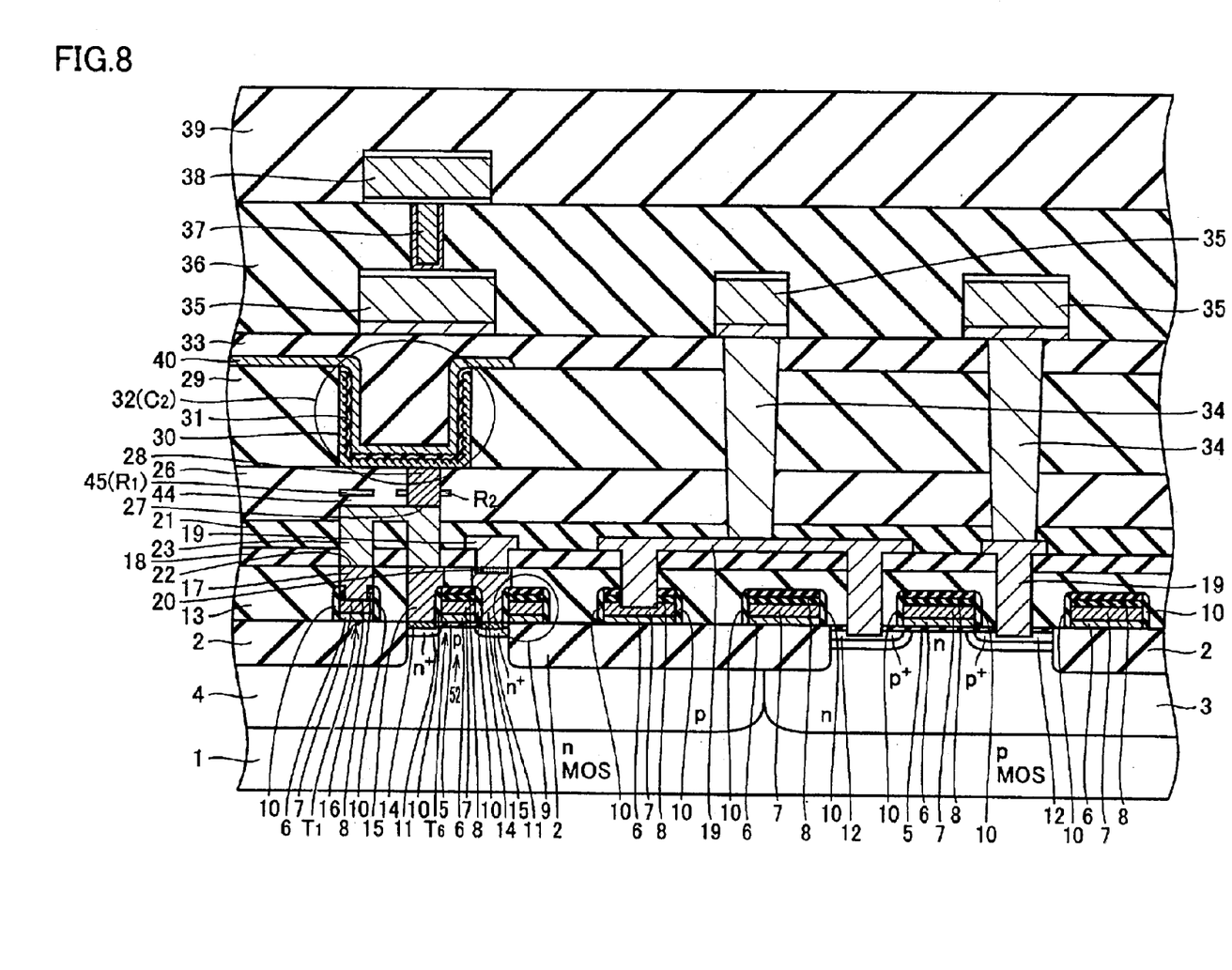
FIG. 8 is a cross sectional view of a semiconductor memory device according to a second embodiment of the present invention.

Referring to FIG. 8, the semiconductor memory device according to the second embodiment of the present invention is identical to that of the first embodiment shown in FIG. 1 except that gate oxide film 24 and TFT 25 in FIG. 1 are replaced with an interlayer silicon oxide film 44 and a high-resistance polysilicon 45. According to FIG. 8, access transistor $T_6$ is formed on the silicon substrate, and capacitor 32 ($C_2$) is formed above the access transistor $T_6$. The source/drain region 11 of access transistor $T_6$ is electrically connected to storage node 30 of capacitor 32 ($C_2$) via conductive path 14, 15, 27,28 penetrating interlayer insulating films 13, 18, 21, 44,26. The gate electrode of transistor $T_1$ is connected with interlayer silicon oxide film 44 and high-resistance polysilicon 45 ($R_2$) via a plug interconnection.

Figure 9:
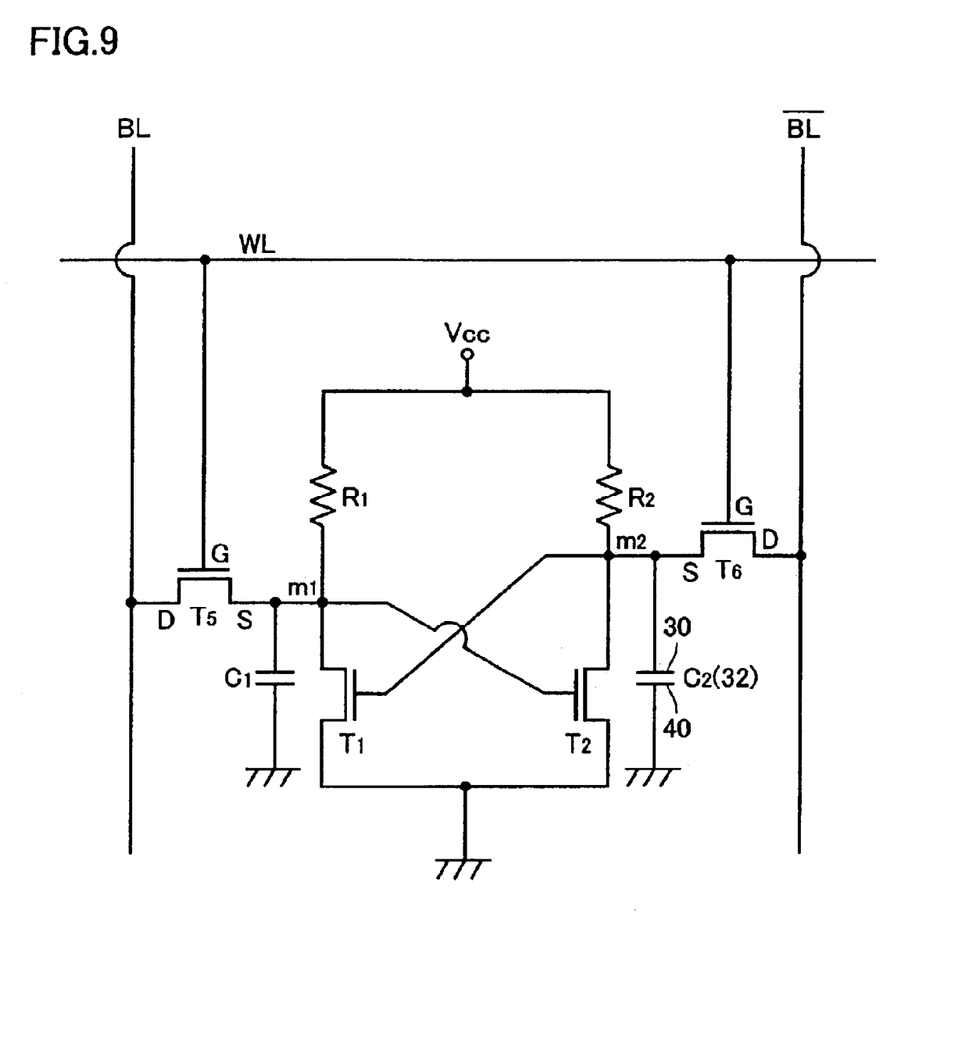
FIG. 9 is a circuit diagram of the semiconductor memory device shown in FIG. 8.

Referring to FIG. 9, the source S of access transistor $T_5$ having its drain D connected to bit line BL is electrically connected with storage node 30 of capacitor $C_1$, forming a portion corresponding to a conventional DRAM memory cell. The source S of access transistor $T_6$ having its drain D connected to complementary bit line/BL is electrically connected with storage node 30 of capacitor $C_2$, also forming the portion corresponding to the conventional DRAM memory cell.

Drive transistor $T_1$ and high-resistance polysilicon $R_1$ form one node, and drive transistor $T_2$ and high-resistance polysilicon $R_2$ form another node. The flip-flop circuit formed of these two nodes functions as a latch circuit for the above-described DRAM memory cell. Since the inverter of the flip-flop circuit is formed from a combination of electric resistance and transistor, the manufacturing process is simplified compared to the case where an inverter is formed of two CMOS transistors, so that a less expensive semiconductor memory device can be provided.

Writing and reading of signals in the memory cell circuit described above are now explained. Bit line BL and complementary bit line/BL are connected to the above-described memory cell. At the time of writing, a word line is turned on and opposite signals are applied to bit line BL and complementary bit line/BL. For example, when an on potential is applied to bit line BL, a potential of connect point m1 attains a high potential (the on potential), and thus, capacitor $C_1$ is charged. A minus potential or zero potential is applied to connect point m2 from complementary bit line/BL, so that connect point m2 attains an off potential, and capacitor $C_2$ is uncharged. In the flip-flop circuit, connect point m1 has a high potential, while connect point m2 has a zero potential. The potential at connect point m1 is maintained. Thus, even if charges are leaking out of capacitor $C_1$, charges in compensation for the leakage are refilled to maintain the predetermined potential of connect point m2.

On the other hand, at the time of reading, a potential difference between bit line BL and complementary bit line/BL is sensed and amplified by a sense amplifier, to read data. In either case, connect points m1, m2 are maintained at the predetermined potentials, so that leakage of capacitors $C_1$, $C_2$ is prevented. As a result, the charges of the capacitors can be kept constant without refresh. Thus, power required for the refresh is saved.

Some of the transistors in FIG. 9 are shown in cross section in FIG. 8. Among them, transistor $T_1$ is a drive transistor of an inverter. Silicon oxide film 44 and high-resistance polysilicon 45 constitute a load portion. Transistor $T_1$ has its gate electrode connected to source S of access transistor $T_6$ via plug contacts 27, 15, 14 and contacts 17, 23. The conductive layer 27 within the plug contact is connected via plug contact 28 to storage node 30 of capacitor $C_2$. Another electrode of this capacitor $C_2$ is set to a ground potential. Another high-resistance polysilicon 45 is connected to another capacitor $C_1$, through plug contacts not shown in cross section in FIG. 8.

The above-described high-resistance polysilicon 45 is formed above other transistors $T_1$, $T_2$, thereby forming a three dimensional structure. Thus, the device is remarkably downsized compared to the case of forming an SRAM memory cell.

The method for manufacturing the semiconductor memory device shown in FIG. 8 is now explained. The manufacturing method in the first embodiment is applicable to the manufacture of the semiconductor memory device of the second embodiment up to the process step shown in FIG. 5. FIG. 5 shows the state where interlayer insulating film 21 has been deposited following the formation of tungsten interconnection 19.

Figure 10:
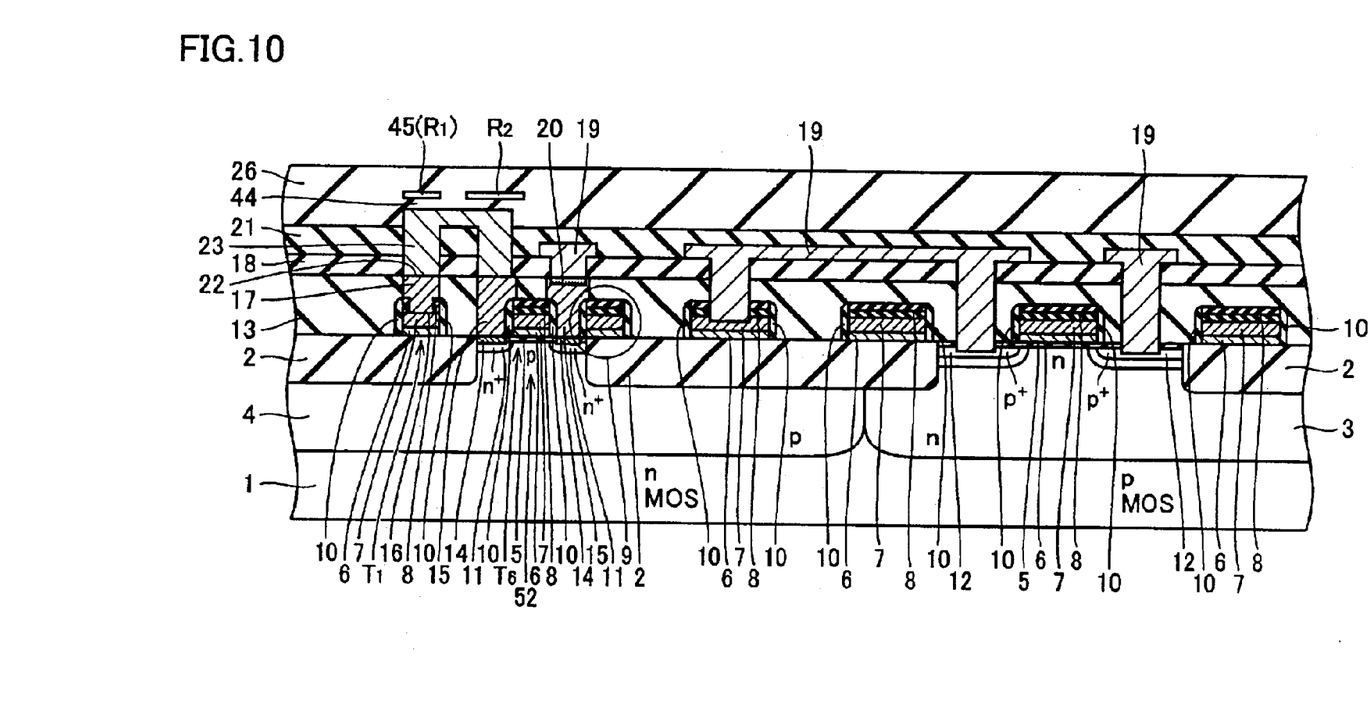
FIG. 10 illustrates a state where an interlayer silicon oxide film is formed following formation of an electric resistance region.

Thereafter, referring to FIG. 10, interlayer silicon oxide films 18, 21 are etched to form a buried contact 22, for connection with poly pads 15, 17. At this time, contact dimension may be reduced by depositing and etching a silicon nitride film.

Next, a doped polysilicon is deposited and etched to form a polysilicon interconnection 23. A silicon oxide film is then deposited to form a silicon oxide film 44. Next, a non-doped polysilicon is deposited and etched to form a high-resistance polysilicon 45. At this time, phosphorus or the like may be introduced to attain a high resistance of a desired level. Next, arsenic is selectively introduced into the interconnection region of high-resistance polysilicon 45, to form a medium level resistance region. With this process, electric resistance $R_2$ connected to the gate of drive transistor $T_1$ is formed (see FIG. 9). Formation of the high-resistance polysilicon is easier than formation of a CMOS transistor, and also reduces the manufacturing cost.

Next, an interlayer silicon oxide film 26 is deposited. Interlayer silicon oxide film 44, high-resistance polysilicon 45 and interlayer silicon oxide film 26 are collectively etched to form a buried contact 27, to connect polysilicon interconnection 23 and high-resistance polysilicon 45 with storage node 30. Next, a doped polysilicon is deposited and etched to form a poly-pad 28, to fill buried contact 27.

Next, a silicon nitride film/silicon oxide film 29 is deposited and etched for formation of a cylindrical capacitor enlarging the capacitor area. Doped polysilicon and amorphous polysilicon are deposited and subjected to a surface roughening process, to form a storage node 30. Next, a silicon nitride film is deposited and oxidized to form a capacitor film 31, and at the same time, a doped amorphous polysilicon is deposited and etched to form the cylindrical capacitor 32.

Next, an interlayer silicon oxide film 33 is deposited. Interlayer silicon oxide films 21, 44, 26, 29, 33 are etched to form a metal contact 34, for connection of the capacitor. TiN, W are deposited and etched, and Al—Cu, TiN are sputtered and etched, so that a metal interconnection 35 is formed. Next, an interlayer silicon oxide film 36 is deposited, and then etched to form a metal contact 37, for connection with the metal interconnection. Subsequently, TiN, W are deposited and etched, and Al—Cu, TiN are sputtered and etched, to form a metal interconnection 38. Next, plasma silicon nitride film and polyimide film are formed as a passivation film 39, and a scribe line bonding pad is etched.

The manufacturing method described above includes a step of forming an access transistor and a capacitor constituting a conventional DRAM memory cell (a1), and further includes, within the relevant step, a step of forming a latch circuit with a combination of a pair of inverters each formed of an electric resistance of, e.g., high-resistance polysilicon and a drive transistor (a2). Such a manufacturing method can be realized by slightly modifying the existing DRAM production lines. The transistors not shown in cross section in FIG. 8 are those formed on the silicon substrate surface, which are formed using a common MOS transistor forming method. Accordingly, a semiconductor memory device corresponding to the circuit shown in FIG. 2 can be manufactured based on the above explanation in conjunction with FIGS. 8 and 10.

Remarks on the Embodiments (1) Although a flip-flop circuit has been taken as an example of the latch circuit in the embodiments described above, the latch circuit may be configured with any circuit as long as it can maintain the potential of storage node for a predetermined cycle time. For example, if one bit is formed with two DRAM cells, the cells may be configured such that one bit holds data while the other bit is being refreshed. In this case, again, a battery back-up is impossible, since a current actually flows during the refresh.

It is particularly preferred that at least one of the circuit elements constituting the latch circuit is located above the access transistor, for the purpose of downsizing the semiconductor memory device of the present invention. Such a three-dimensional structure can reduce its two-dimensional size.

(2) Further, it is preferred that the access transistor is arranged in the surface layer of the semiconductor substrate, the capacitor is arranged in the upper interlayer insulating film located on the semiconductor substrate with at least one interlayer insulating film interposed therebetween, and the latch circuit is formed at a level lower than that of the upper interlayer insulating film. With such a configuration, it is possible to realize three-dimensional arrangement of portions of the semiconductor memory device in the order from bottom to top of, e.g., silicon substrate, access transistor, latch circuit and capacitor, partially overlapping with each other in a vertical direction. As such, the two-dimensional size can be reduced while eliminating refresh. In addition, the latch circuit can be formed by modifying a conventional manufacturing method to realize the manufacturing method of the present invention, with which it is easier to electrically connect the latch circuit to a conductive path connecting the source/drain region of the access transistor and the storage node. A portion to which the latch circuit is being electrically connected may be any portion as long as it is within the conductive path including the storage node and the source/drain region of the access transistor.

(3) The electric resistance in the inverter constituting the flip-flop circuit is preferably formed of a polysilicon portion including impurity, for simplicity in manufacturing. Alternatively, the electric resistance may be formed with a material other than silicon.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
  a capacitor located above a semiconductor substrate, having a storage node and holding charges corresponding to a logical level of binary information;
  an access transistor located in a surface of said semiconductor substrate and controlling input/output of the charges accumulated in said capacitor; and
  a latch circuit located on said semiconductor substrate and maintaining a potential of the storage node of said capacitor,
  at least one of circuit elements constituting said latch circuit being located above said access transistor.

2. The semiconductor memory device according to claim 1, wherein said latch circuit includes no circuit for refreshing charges of said capacitor.

3. The semiconductor memory device according to claim 2, arranged in said semiconductor substrate and in a plurality of interlayer insulating films stacked on said semiconductor substrate, wherein
  said access transistor is arranged on the surface of said semiconductor substrate,
  said capacitor is arranged in an upper interlayer insulating film among said plurality of interlayer insulating films that is located on said semiconductor substrate with at least another one of said interlayer insulating films interposed therebetween, and said latch circuit is arranged at a level lower than said upper interlayer insulating film.

4. The semiconductor memory device according to claim 3, wherein said latch circuit is a flip-flop circuit formed of a first inverter including a first load transistor and a first drive transistor, and a second inverter including a second load transistor and a second drive transistor, and the flip-flop circuit is electrically connected to said storage node.

5. The semiconductor memory device according to claim 4, wherein said first and second load transistors are formed of thin film transistors that are located above said access transistor.

6. The semiconductor memory device according to claim 3, wherein said latch circuit is a flip-flop circuit formed of a first inverter including a first electric resistance and a first drive transistor, and a second inverter including a second electric resistance and a second drive transistor, and the flip-flop circuit is electrically connected to said storage node.

7. The semiconductor memory device according to claim 6, wherein said first and second electric resistances are formed of polysilicon portions including impurities that are located above said access transistor.

8. The semiconductor memory device according to claim 2, wherein said latch circuit is a flip-flop circuit formed of a first inverter including a first load transistor and a first drive transistor, and a second inverter including a second load transistor and a second drive transistor, and the flip-flop circuit is electrically connected to said storage node.

9. The semiconductor memory device according to claim 8, wherein said first and second load transistors are formed of thin film transistors that are located above said access transistor.

10. The semiconductor memory device according to claim 2, wherein said latch circuit is a flip-flop circuit formed of a first inverter including a first electric resistance and a first drive transistor, and a second inverter including a second electric resistance and a second drive transistor, and the flip-flop circuit is electrically connected to said storage node.

11. The semiconductor memory device according to claim 10, wherein said first and second electric resistances are formed of polysilicon portions including impurities that are located above said access transistor.

* * * * *